US010024719B2

(12) United States Patent
Zernickel et al.

(10) Patent No.: US 10,024,719 B2
(45) Date of Patent: Jul. 17, 2018

(54) MEASUREMENT OBJECT, METHOD FOR THE PRODUCTION THEREOF AND DEVICE FOR THE THERMAL TREATMENT OF SUBSTRATES

(71) Applicant: CENTROTHERM PHOTOVOLTAICS AG, Blaubeuren (DE)

(72) Inventors: Dieter Zernickel, Amstetten (DE); Steffen Mueller, Ulm (DE)

(73) Assignee: CENTROTHERM PHOTOVOLTAICS AG (DE)

( * ) Notice: Subject to any disclaimer, the term of this patent is extended or adjusted under 35 U.S.C. 154(b) by 268 days.

(21) Appl. No.: 14/898,175

(22) PCT Filed: Jun. 13, 2014

(86) PCT No.: PCT/EP2014/062408
§ 371 (c)(1),
(2) Date: Dec. 14, 2015

(87) PCT Pub. No.: WO2014/198912
PCT Pub. Date: Dec. 18, 2014

(65) Prior Publication Data
US 2016/0131532 A1  May 12, 2016

(30) Foreign Application Priority Data
Jun. 13, 2013  (DE) .................. 10 2013 009 925

(51) Int. Cl.
*G01J 5/00* (2006.01)
*G01K 13/00* (2006.01)
(Continued)

(52) U.S. Cl.
CPC ............... *G01J 5/08* (2013.01); *G01J 5/0007* (2013.01); *G01J 5/0887* (2013.01); *G01J 5/522* (2013.01);
(Continued)

(58) Field of Classification Search
USPC .................................. 374/120, 121, 130, 141
See application file for complete search history.

(56) References Cited

U.S. PATENT DOCUMENTS

| 5,128,514 A | 7/1992 | Lehmann et al. |
| 5,318,362 A | 6/1994 | Schietinger et al. |

(Continued)

FOREIGN PATENT DOCUMENTS

| DE | 19531536 | 2/1997 |
| DE | 102004032457 | 2/2006 |

*Primary Examiner* — Mirellys Jagan
(74) *Attorney, Agent, or Firm* — Tarolli, Sundheim, Covell & Tummino LLP

(57) ABSTRACT

A measuring object for use in a heating apparatus for the thermal treatment of substrates is described, wherein the measuring object is the substrate to be treated or an object which in use has a substantially known temperature relation to the substrate to be treated, wherein the measuring object comprises a surface having at least one surface area, which acts as a measuring surface for an optical temperature measurement. A predetermined structure in the form of a plurality of recessions is formed in the surface area, in order to influence the emissivity of the surface area.

10 Claims, 5 Drawing Sheets

(51) Int. Cl.
*G01J 5/08* (2006.01)
*G01J 5/52* (2006.01)
*H01L 21/67* (2006.01)
*H01L 21/687* (2006.01)
*F28F 13/18* (2006.01)

(52) U.S. Cl.
CPC .... *H01L 21/67115* (2013.01); *H01L 21/6875* (2013.01); *H01L 21/68735* (2013.01); *F28F 13/185* (2013.01)

(56) References Cited

U.S. PATENT DOCUMENTS

| | | | | |
|---|---|---|---|---|
| 6,349,270 | B1* | 2/2002 | Gurary | G01J 5/0022 374/126 |
| 6,492,625 | B1* | 12/2002 | Boguslavskiy | C23C 16/46 118/725 |
| 2003/0168174 | A1* | 9/2003 | Foree | C23C 16/45521 156/345.51 |
| 2005/0217569 | A1* | 10/2005 | Ramaswamy | C23C 16/4405 117/105 |
| 2005/0223994 | A1* | 10/2005 | Blomiley | C23C 14/505 118/725 |
| 2006/0228897 | A1 | 10/2006 | Timans | |
| 2009/0245320 | A1 | 10/2009 | Timans | |
| 2011/0129947 | A1* | 6/2011 | Mangum | H01L 22/20 438/14 |
| 2012/0171377 | A1* | 7/2012 | Volf | H01L 21/68757 427/255.28 |
| 2012/0193765 | A1* | 8/2012 | Kelekar | H01L 21/02002 257/629 |
| 2012/0227667 | A1* | 9/2012 | Huang | C30B 25/12 118/728 |
| 2013/0126515 | A1* | 5/2013 | Shero | H05B 1/0233 219/444.1 |
| 2014/0261187 | A1* | 9/2014 | Krishnan | C23C 16/4584 118/730 |
| 2014/0360430 | A1* | 12/2014 | Armour | C23C 16/4586 118/725 |
| 2015/0292815 | A1* | 10/2015 | Ranish | C30B 25/12 165/185 |

* cited by examiner

Fig. 3
(a)
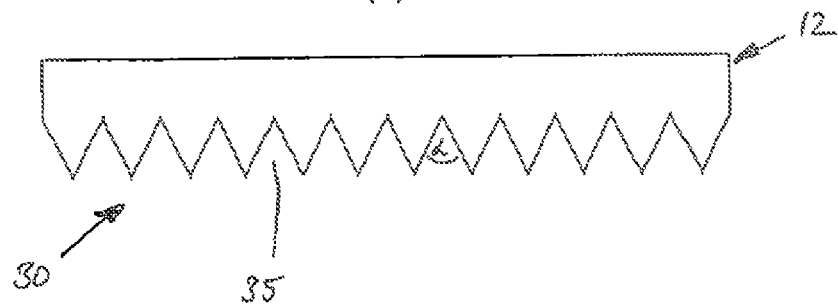
(b)
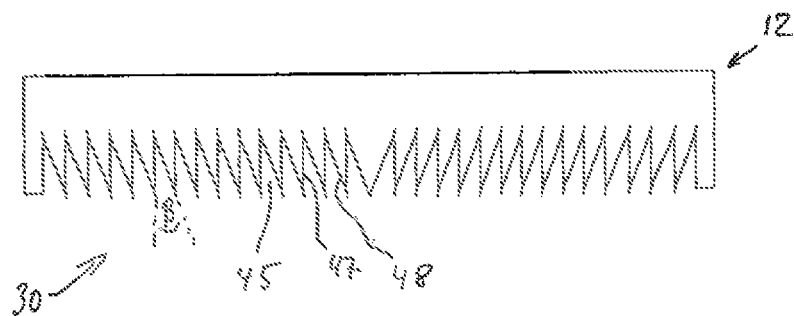
(c)
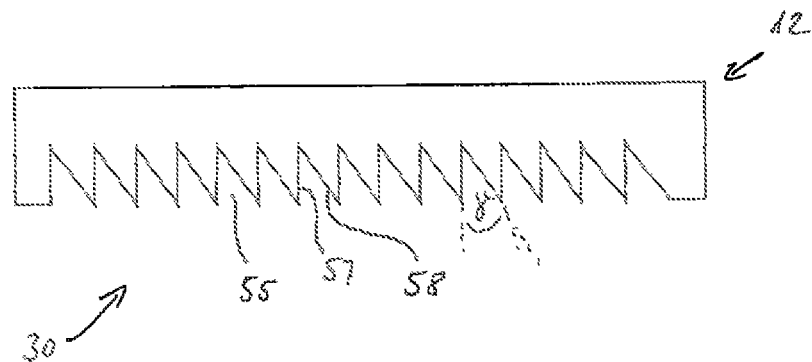

Fig. 4
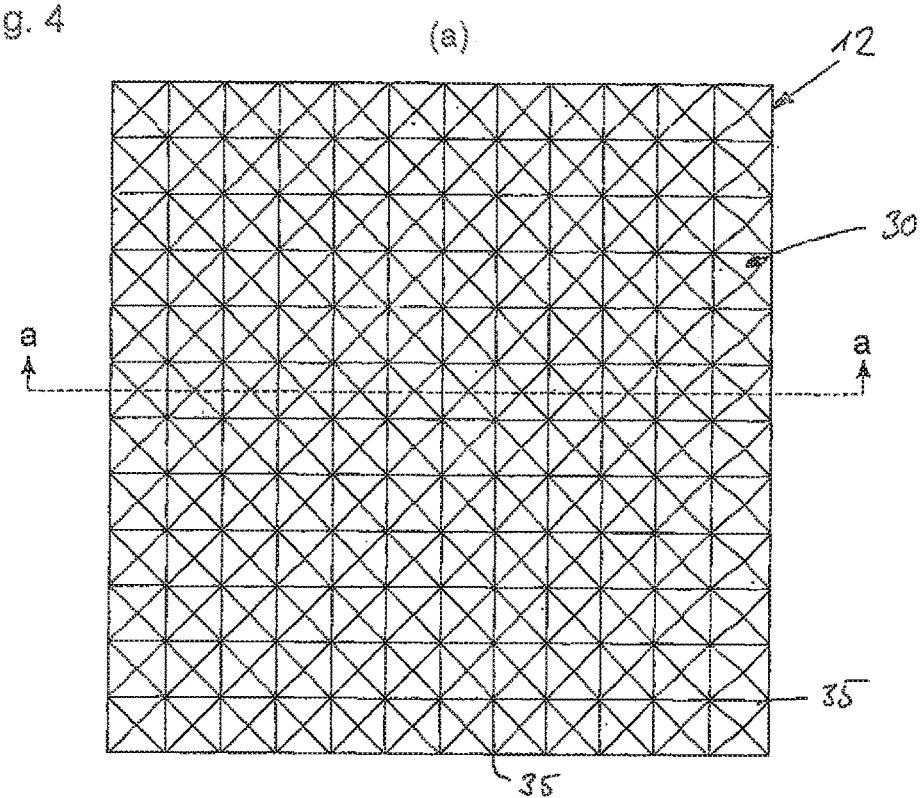
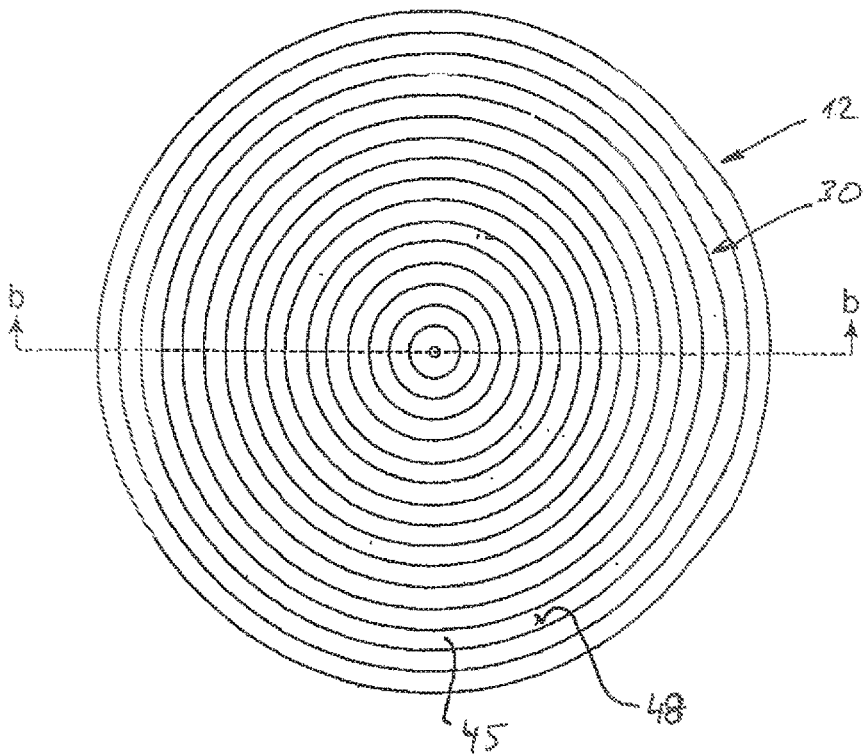

MEASUREMENT OBJECT, METHOD FOR THE PRODUCTION THEREOF AND DEVICE FOR THE THERMAL TREATMENT OF SUBSTRATES

RELATED APPLICATIONS

This application corresponds to PCT/EP2014/062408, filed Jun. 13, 2014, which claims the benefit of German Application No. 10 2013 009 925.0, filed Jun. 13, 2013, the subject matter, of which are incorporated herein by reference in their entirety.

BACKGROUND OF THE INVENTION

The present invention relates in particular to a measuring object for use in a heating apparatus for the thermal treatment of substrates and to a method for manufacturing the same. In use the measuring object has a temperate relation to the substrate to be treated which is in substance known and a surface having at least one surface area, which is used as a measuring area for an optical temperature measurement. Furthermore, the present invention relates to an apparatus for the thermal treatment of substrates, which uses a measuring object of the previously mentioned type.

In the art, different apparatuses and methods for the thermal treatment of substrates are known, as well as apparatuses for determining the temperature of a substrate during a thermal treatment thereof.

A known method for the thermal treatment of substrates, for example provides heating by means of electromagnetic radiation, which is emitted by lamps, for example tungsten halogen lamps. For a closed loop temperature control of the thermal treatment it is known to determine the temperature of the substrates by means of a radiation meter, which is directed onto the substrate or a measuring object, which has a temperature relation to the substrate to be treated which is in substance known. Since, the radiation meter, however, does not only detect radiation emitted by the semiconductor wafer, but in particular also radiation which is reflected by the semiconductor wafer and in some instances also radiation which is transmitted through the semiconductor wafer, it is necessary to distinguish the radiation proportions for the determination of the temperature.

For such a differentiation, U.S. Pat. No. 5,318,386 describes the so called Ripple-technique, in which a modulation is impressed onto the radiation or heat source by means of respective actuation thereof. The modulation originally used was the mains frequency of the power supply and over time the technique was fine tuned and other modulations were used. Temperature changes of the semiconductor wafers occur much slower than the impressed modulation. Thus, the radiation which is emitted by the semiconductor wafer due to its own temperature has negligible (if at all) portions of the impressed, sufficiently fast radiation modulation. The detected modulation proportion in the radiation meter may thus be assigned only to the reflection at the substrate and by measuring or modelling the (modulated) radiation proportion of the heating source and by using appropriate algorithms may be used for calculating the reflectivity and emissivity, respectively of the substrate.

For a temperature measurement, using this technique, it is further necessary to determine the emissivity of the measuring object and subsequently the temperature thereof. The emissivity of an object may depend from the temperature or process reactions and may change in a continuous or discontinuous manner throughout the thermal treatment, wherein the change may be reversible or not. In particular, fast changes of the emissivity may lead to disruptions in the temperature measurement, if the emissivity is determined too slow or not determined at all. The calibration of an emissivity measurement is often difficult, since stable references are not present.

Furthermore, the emissivity of an object also depends on its environment and may thus be significantly different in an in-situ/ex-situ measurement.

SUMMARY OF THE INVENTION

It is therefore an object of the present invention to provide a measuring object, which enables a radiation based temperature determination in an easy manner.

In accordance with the invention, this object is achieved by a measuring object according to claim 1 and a method for manufacturing the same in accordance with claim 10 as well as an apparatus for the thermal treatment of substrates in accordance with claim 7.

Further embodiments of the invention may be derived from the dependent claims and the specification.

In particular, a measuring object for use in an apparatus for the thermal treatment of substrates is provided, wherein the measuring object is the substrate to be treated or the measuring object has a substantially known temperature relation to the substrate to be treated. The measuring object has a surface having at least one surface area, which may be used as a measuring surface for an optical temperature measurement, wherein at the at least one surface area a predetermined structure having a plurality of recessions is formed to increase the emissivity of the measuring object at this surface area. The structure enables a specific adjustment of the emissivity of the measuring object in this area, which is in substance independent of the temperature of the substrate, other process parameters or even coating which may be formed during a process. The determination of the optical characteristics within the structured measuring area is inherently more robust, for example during thermal changes of the substrate, potential surface processes (for example a deposition, re-crystallisation, oxidation, nitridation or similar) and changing process parameters, respectively, which for example relate to stray radiation not coming from the measuring object or the radiation background. This enables a reliable optical temperature measurement, which is more robust with respect to such changes. Since the measuring object is in substance independent with respect to changes of the radiation background or stray radiation, it may be used both in-situ as well as ex-situ. The method is in particular suited for thin measuring objects, which do not allow formation of a cavity for forming a substantially closed radiation space. In particular when used in a rapid thermal treatment, measuring objects should have an as small as possible thermal mass (and are thus typically thin walled) in order to allow quick temperature changes.

In accordance with one embodiment, the measuring object is a susceptor for use in a rapid heating apparatus. Here, a susceptor is a measuring object, which is characterized by its close proximity to the substrate, such that next to a radiation based heat exchange also other heat exchange mechanisms are in effect. Preferably, the susceptor comprises a (as much as possible) stable invariance of its emissivity over a large range of wave lengths. Where applicable, the susceptor may absorb radiation of a first wave length (for example lamp radiation of heating lamps) and may emit a radiation of a second wave length. In order to achieve good temperature correlation between the measuring object and the substrate, the measuring object may be a substrate carrier.

In one embodiment, the recessions are arranged such that they form a plurality of pyramids, while in another embodiment, they are formed to form a saw-tooth structure.

The recessions may in cross section have inclined surfaces, which form an opening angle of ≤ to 60, preferably to ≤ to 40° and in particular to ≤ to 20°, in order to influence the reflectivity of the surface area, in particular to reduce the same.

The apparatus for the thermal treatment of substrates has a process chamber for receiving at least one substrate, a measuring object, of the above type within the process chamber, at least one heating device and an optical temperature measurement unit, which is directed onto the structure of the measuring object. In one embodiment, the apparatus is a cold wall reactor having a plurality of heating lamps and the measuring object is a susceptor, which supports the at least one substrate. In one alternative embodiment, the apparatus is a hot wall reactor and the measuring object is a substrate carrier for receiving the at least one substrate or a wall element of the hot wall reactor.

In the method for manufacturing a measuring object, a predetermined structure in the shape of a plurality of recessions is formed in a planar surface of the measuring object. Prior to and/or after forming the structure, the measuring object may be coated, such that even under aggressive environments, it may achieve a high life time. In particular, a coating of pyrolytic carbon (pyC) or silicon carbide (SiC) on graphite is taken into consideration.

The present invention will be explained in more detail herein below, with reference to the drawings. In the drawings:

BRIEF DESCRIPTIONS OF THE DRAWINGS

Figure 2:
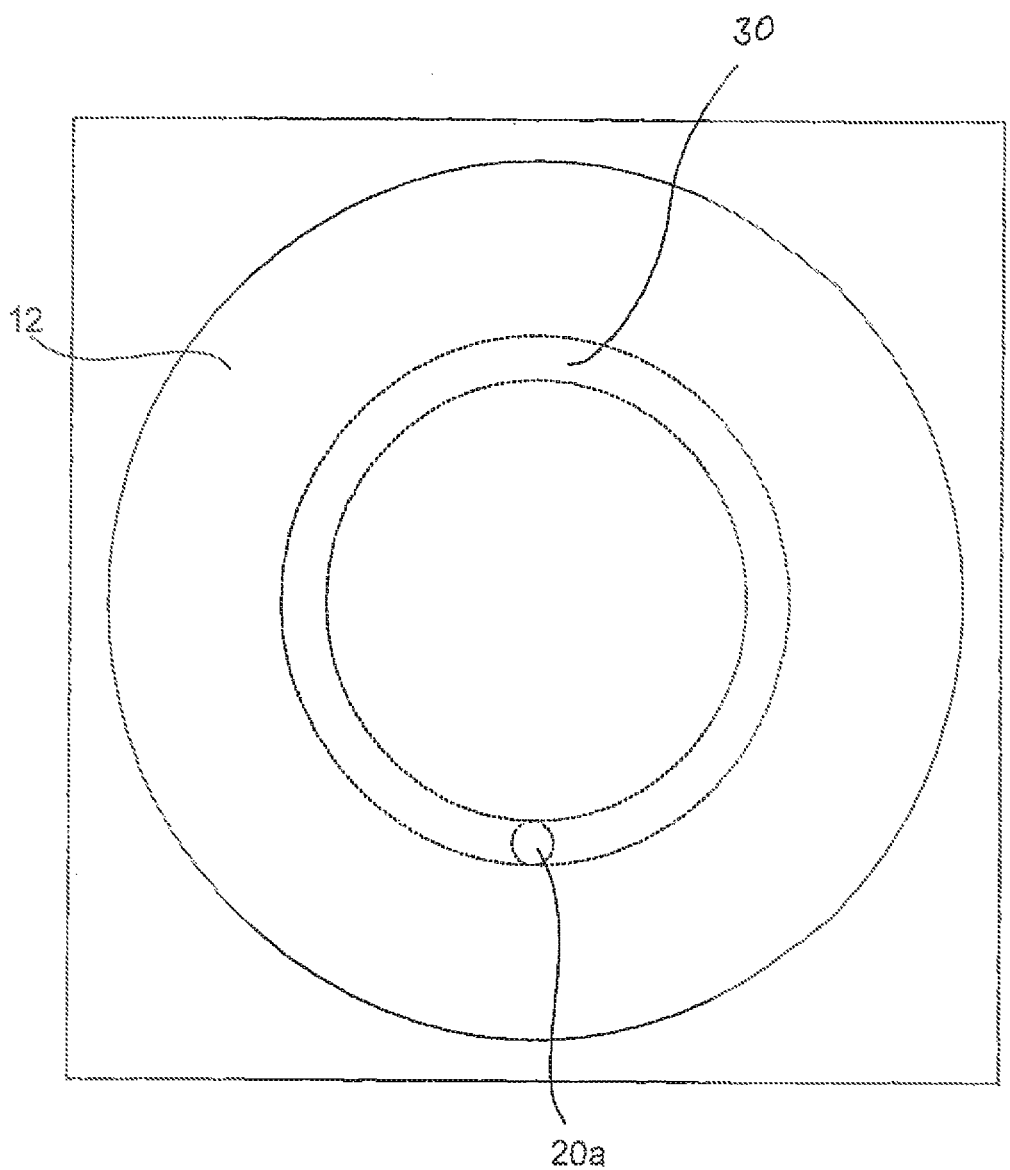
FIG. 2 is a schematic top view onto a susceptor.

FIGS. 3 (a) to (c) are schematic sectional views through a partial area of different embodiments of the susceptor according to FIG. 2.

Figure 4:
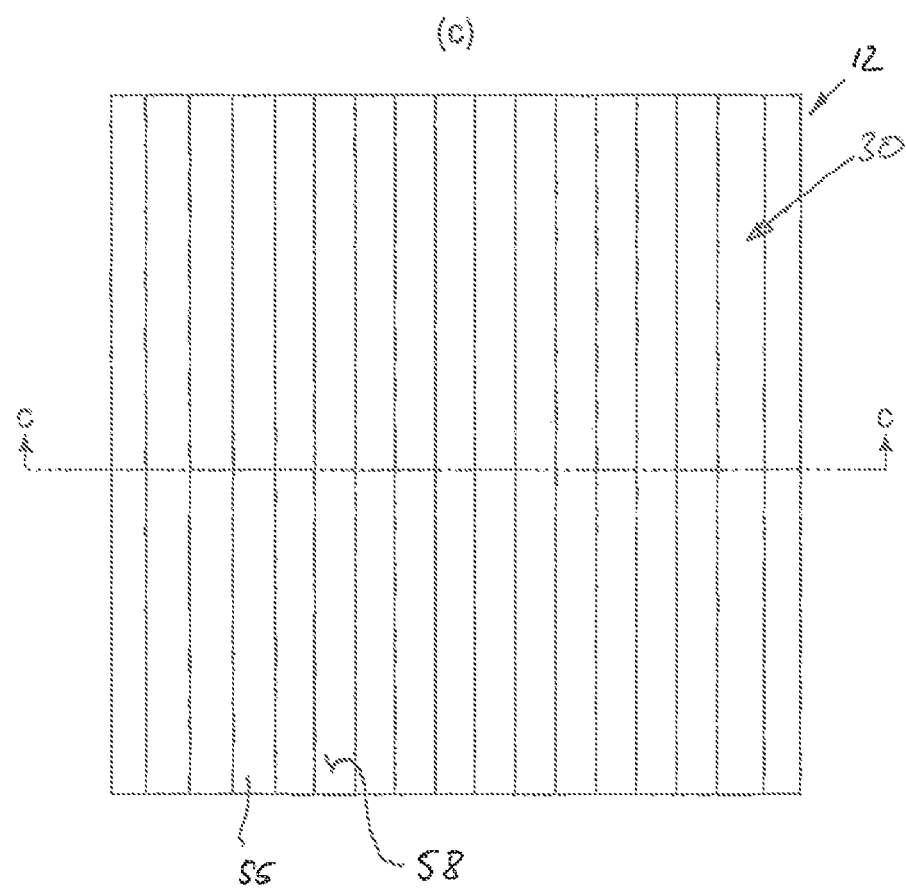

FIGS. 4(a) to 4(c) are top views onto the respective partial areas of FIGS. 3(a) to 3(c).

DESCRIPTION

In the following description, terms such as above, below, left and right and similar terms relate to the figures and should not be seen in a limiting matter, even though they may refer to a preferred embodiment. The term "substantially" with respect to angles and arrangements should encompass deviations of at most 10°, preferably at most 5°, unless other specifications are made. The term "substance" with respect to other information should encompass deviations of at most 10%, preferably at most 5%, unless other specifications are made.

Figure 1:
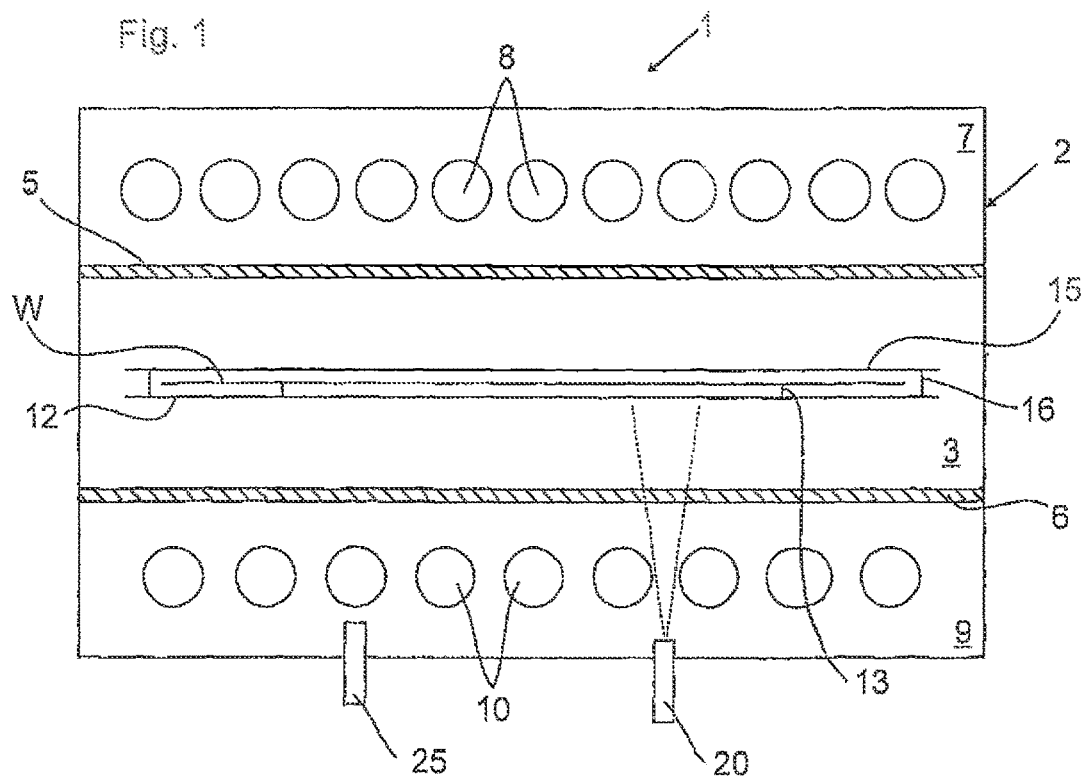
FIG. 1 is a schematic side sectional view through an apparatus for the thermal treatment of semiconductor wafers.

FIG. 1 shows a schematic side sectional view of an apparatus 1 for the thermal treatments of semiconductor wafers W. The apparatus 1 has a housing 2 having an inner chamber, which inter alia forms a process chamber 3. The process chamber 3 is bounded at its upper and lower sides by wall elements 5 and 6, respectively and at its sides by the housing 2. Above the wall element 5, a lamp chamber 7 is provided within the housing 2, which may be mirrored and in which heating source in the form of a plurality of lamps 8 is provided. Below the wall element 6 also a lamp chamber 9, similar to lamp chamber 7, is provided, in which a heating source in the form of a plurality of lamps 10 is provided.

The side walls of the process chamber 3 may also have a certain mirror effect for at least a portion of the electromagnetic radiation present within the process chamber 3. Furthermore, at least one of the side walls of the process chamber 3 has a not shown process chamber door, in order to enable insertion and removal of the semiconductor wafer W. Furthermore, gas inlets and gas outlets (not shown) may be provided for the process chamber 3.

Within the process chamber 3 a substrate receptacle in the form a susceptor 12 having supports 13 is provided, on which the semiconductor wafer W may be placed. The semiconductor wafer W is positioned with respect to the susceptor 12 such that they have the same temperature or at least have a substantially known temperature relation to each other. Above the semiconductor wafer W an optional further susceptor 15 may be provided, such that the semiconductor wafer W is, as shown, received between two susceptors 12, 15. The susceptor 15 may be fixedly provided within the process chamber or it may also be supported via supports 16 on the susceptor 12. Alternatively it is also possible to only provide a susceptor 15 above the semiconductor wafer W and to for example receive the semiconductor W on a holder which is in substance transparent to the lamp radiation. The susceptor 15 may also be a substantially closed box, in which the semiconductor to be treated is received.

The susceptors 12, 15 each have a disk shaped configuration and they may have a circumferential shape corresponding to the circumferential shape of the semiconductor wafer W. On its bottom face the susceptor 12 has a predetermined structure 30, which is formed in the surface thereof. The structure may extend over the complete bottom face or may be formed only in a limited surface area thereof.

The FIGS. 3(a) to 3(c) each show respective sectional views of different susceptors 12 at the structure 30, while FIGS. 4(a) to 4(c) show respective top views onto the respective different structures 30.

The structure 30 according to FIGS. 3(a) and 4(a) is formed by a plurality of parallel extending first V-shaped channels 35 and a plurality of parallel extending second V-shaped channels 35, wherein the second V-shaped channels extend perpendicular to the first V-shaped channels 35. The first and second V-shaped channels are formed and spaced uniformly, such that a plurality of pyramid shaped protrusions (extending from the bottom of the respective channels) is formed. The V-shaped channels each comprise an opening angle α, wherein α≤60°, preferably, α≤40°.

The structure 30 according to FIGS. 3(b) and 4(b) is formed by a plurality of circular channels 45, which are arranged concentrically with respect to each other. The channels 45 in cross section form a saw-tooth configuration. In particular, the channels 45 each have a first side wall 47, which extends in substance perpendicular to the surface of the susceptor 12, as well as a second side wall 48, which extends with respect to the first side wall 47 under an angle β, wherein β≤40°, preferably, β≤20°. The channels 45 are formed and spaced uniformly such that a uniform saw-tooth configuration is formed.

The structure 30 according to FIGS. 3(c) and 4(c) is formed by a plurality of parallel channels 55. The channels 55 in cross section form a saw-tooth configuration. In particular, the channels 55 each comprise a first side wall 57, which extends in substance perpendicular to the surface of the susceptor 12, as well as a second side wall 58, which extends with respect for the first side wall 57 under an angle γ, wherein γ≤40°, preferably γ23 20°.

The channels 45 are formed and spaced uniformly, such that a uniform saw-tooth configuration is formed.

The susceptor 12 may optionally be connected to a rotation mechanism (not shown) in order to rotate a semiconductor wafer W received thereon, around an axis, which extends in substance perpendicular to the surface of the semiconductor wafer W. In this case, the structure 30 in the susceptor 12 should be provided over the whole bottom surface or in a ring shaped or annular surface area thereof, as indicated in FIG. 2. The rotation may enable homogenizing the temperature of the susceptor 12 and thus the semiconductor wafer W, as is known in the art, in the process chamber 3 a compensation ring may be provided which radially surrounds the semiconductor wafer in its plane, as is known in the art of RTP devices.

The wall elements 5 and 6, which bound the process chamber above and below are each made of quartz and are in substance transparent to the radiation of the lamps 8 and 10, respectively.

The lamps 8 and 10 may be so called flash lamps, which are typically operated in a flash mode, or may be tungsten-halogen lamps, which are typically operated continuously. The lamps may obviously also be arranged in a different manner and it is also possible to combine the lamp types with each other or to also use different lamp types either alone or in combination. In particular, it is also possible, to dispense with the lower lamp chamber 9 and lamps 10 and to provide only the upper lamp chamber 7 with lamps 8 or to dispense with the upper lamp chamber 7 and lamps 8 and to provide only the lower lamp chamber 9 with lamps 10.

The apparatus 1 further comprises a first pyrometer 20, which is directed onto the bottom face of the susceptor 12. Optionally, also a second pyrometer may be provided which may be directed onto at least one of the lamps 10, which may herein below be called lamp pyrometer 25. If an upper susceptor 15 is provided, the first pyrometer 20 could also be directed onto the upper face of the susceptor 15 and the lamp pyrometer 25 could be directed onto one of the lamps 8.

The first pyrometer 20 has a field of view 20a (see FIG. 2), which is directed onto the surface area of the susceptor 12, in which the structure 30 is formed. In the presentation in FIG. 2, the surface area is formed in the shape of a ring or annulus, since it is assumed that the susceptor 12 is supported in a rotatable manner. With a stationary susceptor, the surface area may also have a shape corresponding to the field of view 20a. By using a corresponding predetermined structuring of the surface area, the emissivity of the thus structured surface area may be influenced in a predetermined manner and may particularly be increased. The emissivity of the surface area having the structure 30 may be determined and is substantially more robust with respect to temperature changes of the susceptor and process reactions at the surface thereof.

In particular, the emissivity at the area of the structure may approach an emissivity of 1. Tests with a measuring object made of graphite showed for example a significant increase in the emissivity by forming a pyramid structure in comparison to the emissivity of a corresponding measuring object having an unstructured surface. Thus, the predetermined structuring of the surface area of the measuring object may in particular influence the reflectivity of the surface area of the measuring object.

In the representation of FIG. 1, the first substrate pyrometer 20 is shown such that it extends into the lower lamp chamber 9 and is directed in a perpendicular manner from below onto the susceptor 12. It would also be possible, to attach the first substrate pyrometer at a side of the housing 2 and to direct the same from the side onto a surface area of the susceptor 12 (or 15), which comprises a respective structure 30. The structure 30 could also be formed on a side of the susceptor 12 (or 15) facing the semiconductor wafer W.

The first substrate pyrometer 20 is thus capable of detecting radiation coming from the susceptor (at an in substance known, high emissivity) to detect the temperature of the susceptor and thus indirectly of the semiconductor wafer W. Components of lamp radiation which may directly or indirectly (via reflection) have fallen onto the pyrometer may if needed be compensated for using the Ripple-Technique or variations thereof.

The structure 30 may be formed in any manner in the susceptor 12 (or 15) or any other measuring object, which manner is suitable for obtaining a corresponding predetermined structure.

The invention was previously described with respect to a specific example of a susceptor as a measuring object in a rapid heating device, in which the substrate is directly or indirectly (via the susceptor) heated by lamp radiation. Such devices are also often called cold wall reactors, as they operate without a substantial heating of the chamber walls. The concept of providing a predetermined structure in a measuring object, in order to influence the emissivity of the measuring object in the area of the structure and to thus enable and simplify, respectively, an optical temperature measurement, may also be used in other thermal treatment devices, in particular in so called hot wall reactors. It is for example possible to provide a respective structure in a surface area of any element in a hot wall reactor. In particular, such a respective structure could for example be provided in a substrate carrier for supporting at least one substrate, in particular the structure may be provided in a wafer boat, which supports a plurality of substrates. A respective structure could also be formed in a wall element of a hot wall reactor, in order to for example enable a reliable optical (contactless) temperature measurement of an inner wall of the same. Even thought the measuring object having the predetermined structure is described in the above embodiment as an object which is separate from the substrate to be treated, such a respective structuring could possibly also be formed directly in the substrate to be treated. In so doing, the structure should preferably be formed such that it does not negatively influence the operational characteristics of the substrate later. In the case of a semiconductor wafer, for example formation of a corresponding structure as a micro- or nano-structure by means of a laser on a backside thereof may be feasible. Rather than forming a structure into the measuring object it is also possible to form a respective structure on the surface of the measuring object, for example by means of growing a respective layer or by deposition.

The features of individual embodiments may freely be combined with features of other embodiments, or such features may replace each other, as long as a respective compatibility is given. Instead of upper and lower lamp arrangements, as shown in FIG. 1, a configuration may be provided, wherein one or both of the lamp arrangements are replaced by a microwave plasma arrangement, wherein in such a case typically the upper and lower wall elements made of quartz would be dispensed with.

The invention claimed is:

1. A substrate carrier for the use in an apparatus for the thermal treatment of substrates, wherein in use the substrate carrier comprises:
   a substantially known temperature relation to the substrate to be treated, wherein a measuring object comprises a surface having at least one surface area, which acts as a measuring surface for an optical temperature measurement, and wherein at least one predetermined structure having a plurality of recessions is formed in the at least one surface area, in order to increase the emissivity of the substrate carrier at this surface area compared to the surrounding surface area.

2. The substrate carrier according to claim 1, wherein the substrate carrier is a susceptor for use in a rapid heating apparatus.

3. The substrate carrier according to claim 1, wherein the recessions are arranged such that they form a plurality of pyramids.

4. The substrate carrier according to claim 3, wherein the recessions in cross section comprise inclined surfaces, which are arranged with respect to each other such that they form an opening angle of ≤60°.

5. The substrate carrier according to claim 1, wherein the recessions are arranged such that they form a saw-tooth structure.

6. The substrate carrier according to claim 5, wherein the recessions in cross section comprise inclined surfaces, which are arranged with respect to each other such that they form an opening angle of ≤60°.

7. An apparatus for the thermal treatment of substrates, comprising:
   a process chamber for receiving at least one substrate;
   a substrate carrier according to claim 1 in the process chamber;
   at least one heating device, which is directed onto at least one of the structure of the substrate carrier and the at least one substrate; and
   an optical temperature measurement unit, which is directed onto the structure of the substrate carrier, for capturing the optical temperature measurement.

8. The apparatus according to claim 7, wherein the apparatus is a cold wall reactor having a plurality of heating lamps, and wherein the substrate carrier is a susceptor, which supports the at least one substrate.

9. The apparatus according to claim 7, wherein the apparatus is a hot wall reactor.

10. A method for manufacturing a substrate carrier according to claim 1, wherein a predetermined structure in the form of a plurality of recessions is formed in a planar surface of the substrate carrier.

* * * * *